(12) United States Patent
Shim et al.

(10) Patent No.: US 9,343,697 B2
(45) Date of Patent: May 17, 2016

(54) ADHESIVE FILM AND SEALING METHOD FOR ORGANIC ELECTRONIC DEVICE USING SAME

(71) Applicant: LG CHEM, LTD., Seoul (KR)

(72) Inventors: Jung Sup Shim, Daejeon (KR); Hyun Jee Yoo, Daejeon (KR); Seung Min Lee, Daejeon (KR); Suk Ky Chang, Daejeon (KR); Yoon Gyung Cho, Daejeon (KR); Kyung Yul Bae, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 14/528,828

(22) Filed: Oct. 30, 2014

(65) Prior Publication Data

US 2015/0060836 A1   Mar. 5, 2015

Related U.S. Application Data

(63) Continuation of application No. PCT/KR2013/007055, filed on Aug. 5, 2013.

(30) Foreign Application Priority Data

Aug. 3, 2012   (KR) .................. 10-2012-0085212
Aug. 5, 2013   (KR) .................. 10-2013-0092548

(51) Int. Cl.
*H01L 51/54*   (2006.01)
*H01L 51/52*   (2006.01)
*C09J 7/02*   (2006.01)
*H01L 51/56*   (2006.01)
*C09J 163/00*   (2006.01)

(52) U.S. Cl.
CPC .......... *H01L 51/5246* (2013.01); *C09J 7/0203* (2013.01); *H01L 51/56* (2013.01); *C09J 163/00* (2013.01); *C09J 2203/326* (2013.01); *C09J 2205/102* (2013.01); *C09J 2463/00* (2013.01); *H01L 51/5259* (2013.01); *H01L 2251/556* (2013.01); *Y10T 428/24942* (2015.01); *Y10T 428/28* (2015.01); *Y10T 428/2826* (2015.01)

(58) Field of Classification Search
CPC ............ H01L 51/5246; H01L 51/5259; H01L 21/563
USPC ............................................ 257/100; 438/26
See application file for complete search history.

(56) References Cited

U.S. PATENT DOCUMENTS

2002/0031701 A1   3/2002   Kawakami et al.
2011/0073901 A1   3/2011   Fujita et al.
(Continued)

FOREIGN PATENT DOCUMENTS

CN   101903983   12/2010
CN   102473617   5/2012
(Continued)

*Primary Examiner* — George Fourson, III
(74) *Attorney, Agent, or Firm* — Dentons US LLP

(57) ABSTRACT

Provided are an adhesive film, an organic electronic device (OED) encapsulation product using the same, and a method of encapsulating the organic electronic device, and more particularly, an adhesive film for encapsulating an organic electronic element including a first adhesive layer having a loss coefficient (tan δ) at 60 to 100° C. of 1 to 5, and a second adhesive layer formed on the first adhesive layer, and a method of encapsulating an organic electronic device using the same.

19 Claims, 1 Drawing Sheet

(56) References Cited

U.S. PATENT DOCUMENTS

| | | | | |
|---|---|---|---|---|
| 2012/0313499 | A1* | 12/2012 | Son | H01L 51/529 313/46 |
| 2012/0326194 | A1* | 12/2012 | Son | H01L 51/5259 257/98 |
| 2013/0240862 | A1* | 9/2013 | Yoo | H01L 51/5246 257/40 |
| 2013/0248110 | A1* | 9/2013 | Lee | C09J 163/10 156/330 |
| 2013/0251989 | A1* | 9/2013 | Yoo | C09J 163/00 428/354 |
| 2014/0217621 | A1* | 8/2014 | Yoo | H01L 51/56 257/788 |
| 2015/0062524 | A1* | 3/2015 | Kim | G02F 1/1339 349/153 |
| 2015/0069376 | A1* | 3/2015 | Son | B32B 37/12 257/40 |

FOREIGN PATENT DOCUMENTS

| | | |
|---|---|---|
| JP | 2009-170886 A | 7/2009 |
| KR | 10-2004-0053801 A | 6/2004 |
| KR | 10-2005-0067364 A | 7/2005 |
| KR | 10-2007-0072400 A | 7/2007 |
| KR | 10-2012-0023811 A | 3/2012 |
| KR | 10-2012-0046704 A | 5/2012 |
| TW | 201222684 A1 | 6/2012 |
| WO | 2011/004825 A1 | 1/2011 |
| WO | 2012/060621 A2 | 5/2012 |

\* cited by examiner

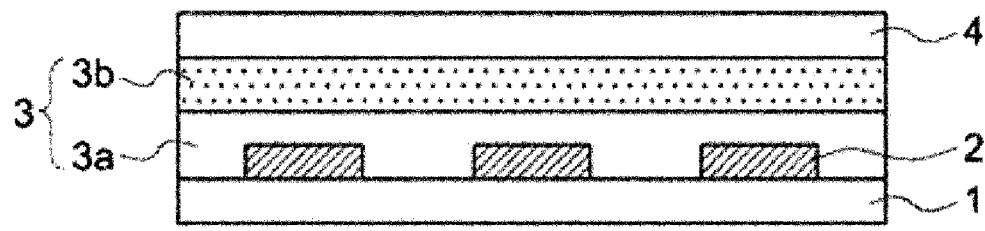

ADHESIVE FILM AND SEALING METHOD FOR ORGANIC ELECTRONIC DEVICE USING SAME

This application is a bypass continuation of International Application No. PCT/KR2013/007055 filed Aug. 5, 2013, which claims priority to Korean Patent Application Nos. 10-2012-0085212 filed Aug. 3, 2012 and 10-2013-0092548 filed Aug. 5, 2013, in the Korean Intellectual Property Office, all of which are incorporated herein by reference.

FIELD OF THE INVENTION

The present invention relates to an adhesive film and a method of encapsulating an organic electronic device (OED) using the same.

DISCUSSION OF RELATED ART

An organic electronic device refers to a device including an organic material layer in which an exchange of charges occurs using holes and electrons, and may include a photovoltaic device, a rectifier, a transmitter and an organic light emitting diode (OLED).

An organic light emitting diode, which is a representative organic electronic device, consumes less power and has a higher response speed than conventional light sources, and is preferable as a thin display device or light. In addition, the organic light emitting diode has excellent space utilization, and thus is expected to be applied in various fields including all kinds of portable devices, monitors, notebook computers and TVs.

To extend compatibility and use of the organic light emitting diode, the most important problem is durability. Organic materials and metal electrodes included in the organic light emitting diode are very easily oxidized by external factors such as moisture. Accordingly, a product including the organic light emitting diode is very sensitive to environmental factors. Therefore, various methods have been suggested to effectively prevent permeation of oxygen or moisture from an external environment into an organic electronic device such as the organic light emitting diode.

Conventionally, a method of processing a metal can or glass in the form of a cap to have a groove, loading a powder-type desiccating agent for absorbing moisture into the groove or forming a desiccating agent as a film to be adhered to the can or glass using a double-sided tape.

In Korean Laid-Open Patent Application No. 2007-0072400, a rate of permeation of moisture into an organic electronic device can be reduced by chemically absorbing moisture permeating into the organic electronic device by including a moisture absorbent in an epoxy sealant. However, as the moisture absorbent reacts with moisture and expands in volume, it can physically damage the organic electronic device. In addition, when a metal oxide is used as the moisture absorbent, it reacts with moisture to prepare a strong base material, which can chemically damage a protective layer and an anode layer.

In addition, as a conventional adhesive film for encapsulation, it is difficult to overcome a step difference with a substrate in a temperature range for lamination and curing in an organic light emitting diode encapsulating process.

Accordingly, there is demand for developing an encapsulant to effectively prevent permeation of moisture, reduce damage to an organic electronic device, and ensure a characteristic of overcoming a step difference during lamination and curing in an organic light emitting diode encapsulating process.

SUMMARY OF THE INVENTION

The present invention is directed to providing an adhesive film, an organic electronic device encapsulating product using the same, and a method of encapsulating an organic electronic device.

In one aspect, the present invention provides an adhesive film for encapsulating an organic electronic element, which includes a first adhesive layer having a loss coefficient tan δ at 60 to 100° C. of 1 to 5; and a second adhesive layer formed on one surface of the first adhesive layer.

In another aspect, the present invention provides an organic electronic device encapsulation product, which includes a substrate; an organic electronic device formed on the substrate; and the adhesive film encapsulating the organic electronic device, in which the first adhesive layer of a curable adhesive layer of the adhesive film covers the organic electronic device.

In still another aspect, the present invention provides a method of encapsulating an organic electronic device, which includes applying the adhesive film to a substrate on which an organic electronic device is formed to cover the organic electronic device with a first adhesive layer of an adhesive layer of the adhesive film; and curing the adhesive layer.

EFFECT

When an organic electronic device is encapsulated using an adhesive film according to exemplary embodiments of the present invention, even after lamination and curing are performed, precipitation of a moisture absorbent included in an adhesive layer can be prevented to enhance durability of the organic electronic device, and a step difference caused by an organic electronic device present between a substrate and an adhesive film can be overcome to encapsulate the organic electronic device without lift-off of the adhesive film because of suitable flowability.

BRIEF DESCRIPTION OF THE DRAWINGS

FIG. 1 is a cross-sectional view of an organic electronic device encapsulation product according to an exemplary embodiment of the present invention.

DETAILED DESCRIPTION OF EXEMPLARY EMBODIMENTS

Hereinafter, exemplary embodiments of the present invention will be described in further detail. Descriptions of conventional functions or components may be omitted. In addition, the accompanying drawings are schematic and parts that are not directly relevant to the invention may be omitted for the sake of clarity and concision. Also, the thicknesses and relative proportions of layers and regions may be exaggerated for better visibility, and this is not intended to limit the scope of the present invention.

The present invention relates to an adhesive film for encapsulating an organic electronic element, the adhesive film including a first adhesive layer having a loss coefficient tan δ at 60 to 100° C. of 1 to 5, and a second adhesive layer formed on one surface of the first adhesive layer. In addition, the first adhesive layer may have a lower viscosity than the second adhesive layer.

In addition, the adhesive film according to an exemplary embodiment of the present invention can encapsulate an organic electronic device, and includes a multi-layered curable adhesive layer. Particularly, the adhesive film may include a curable adhesive layer including a curable resin and a moisture absorbent, in which the curable adhesive layer may have a multi-layered structure including at least two continuously formed adhesive layers, not a single-layered structure. Here, the first adhesive layer may include a moisture absorbent at 0 to 20%, and the second adhesive layer may include a moisture absorbent at 80 to 100%, based on a total weight of the moisture absorbent in the first and second adhesive layers. The curable adhesive layer may have a multi-layered structure including a first adhesive layer in contact with an organic electronic device and a second adhesive layer directly formed on the first adhesive layer in the encapsulation of the organic electronic device and not in contact with the organic electronic device.

The term "organic electronic device (OED)" refers to a material or device having a structure including an organic material layer in which an exchange of charges occurs using holes and electrons between a pair of electrodes facing each other. Examples include a photovoltaic device, a rectifier, a transmitter, and an organic light emitting diode, but the present invention is not limited thereto. In one example of the present invention, the organic electronic device may be an organic light emitting diode.

In the specification, the curable adhesive layer may be an adhesive that can be maintained in a solid or semi-solid state at room temperature, can attach a planar plate without bubbles due to flowability when heat is applied, and can firmly fix a target with the adhesive when a curing reaction is terminated. The curable adhesive layer may be the first adhesive layer or second adhesive layer.

In the adhesive film including such a multi-layered curable adhesive layer, a loss efficiency tan δ at temperatures for laminating and curing a lower adhesive layer, that is, the first adhesive layer, with the organic electronic device may be 1 or more. The adhesive films according to exemplary embodiments of the present invention have temperatures for thermal lamination and curing of approximately 60 to 100° C. when applied to a process of encapsulating the organic electronic device. Since the organic electronic device such as an organic light emitting diode is vulnerable to high temperature, the lamination and curing processes are preferably limited to the above temperature range.

In the adhesive film for encapsulating an organic electronic device, the lower adhesive layer in contact with the organic electronic device, i.e., the first adhesive layer, necessarily has a characteristic of overcoming a step difference formed by a plurality of organic electronic devices formed on a substrate. The organic electronic devices may be perfectly encapsulated with the adhesive film without lift-off or an empty space. Accordingly, the first adhesive layer may have suitable flowability at lamination and curing temperatures of approximately 60 to 100° C., and a higher loss modulus G" than a storage modulus G'. That is, a loss coefficient tan δ has a value of loss modulus G"/storage modulus G', which may be 1 or more. In addition, when the flowability of the first adhesive layer is excessively high, it is possible for durability problems such as burr generation to arise, and the maximum value of the loss coefficient may be 5 or more. The storage modulus and loss modulus may be measured by a viscoelasticity test according to a standardized test method such as JIS.

As the viscoelasticity of the lower layer of the curable adhesive layer, that is, the first adhesive layer, is controlled as described above, a characteristic of overcoming a step difference in the process of encapsulating the organic electronic device may be ensured. It is not necessary to strictly control the viscoelasticity of the upper layer that is not directly in contact with the organic electronic device, that is, the second adhesive layer.

Since the first or second adhesive layer of the curable adhesive layer includes a moisture absorbent and/or a filler, it can block permeation of moisture input from an external environment. The moisture absorbent absorbs moisture or vapor by chemically reacting with vapor, moisture or oxygen inside of the adhesive layer. Since volume expansion caused by the reaction between the moisture absorbent and moisture in the adhesive film can exceed the limit controlled by a curable resin, a crack may be formed in a film of the organic electronic device. Thus, it is preferable that a viscosity at a temperature of laminating and curing each adhesive layer of the curable adhesive layers, that is, the first and second adhesive layers, is 3,000 poises or more. When the adhesive layer has a viscosity of 3,000 poises or more, precipitation and movement of the moisture absorbent or filler included in the first or second adhesive layer can be prevented. However, when the viscosity is excessively high, wettability of a surface of the adherent may be degraded, and thus the upper limit of the viscosity of the first or second adhesive layer of the adhesive film is preferably less than 300,000 poises.

In the curable adhesive layer, when more of the moisture absorbent is included in the second adhesive layer not in contact with the organic electronic device, which is directly formed on the first adhesive layer, than the first adhesive layer in contact with the organic electronic device in the encapsulation of the organic electronic device, probability of damage to the organic electronic device may be reduced, and in one example, the moisture absorbent may be included in an amount of 0 to 20% in the first adhesive layer, and in an amount of 80 to 100% in the second adhesive layer based on the total weight of the moisture absorbent in the curable adhesive layer.

Accordingly, the second adhesive layer having a larger amount of the moisture absorbent further preferably has a viscosity of 5,000 poises or more.

Particularly, the first adhesive layer may have a viscosity at 60° C. of 3,000 to 300,000 poises, 5,000 to 300,000 poises, 100,000 to 290,000 poises, 110,000 to 250,000 poises or 130,000 to 200,000 poises, and a viscosity at 100° C. of 3,000 to 300,000 poises, 3,000 to 100,000 poises, 3,000 to 10,000 poises or 3,000 to 5,000 poises.

In addition, the second adhesive layer may have a viscosity at 60° C. of 3,000 to 300,000 poises, 5,000 to 300,000 poises, 110,000 to 300,000 poises, 150,000 to 290,000 poises, 200,000 to 290,000 poises, or 240,000 to 290,000 poises, and a viscosity at 100° C. of 3,000 to 300,000 poises, 5,000 to 300,000 poises, 5,000 to 100,000 poises, 5,000 to 10,000 poises, or 5,000 to 9,000 poises.

The adhesive film may have a viscosity at room temperature of $10^6$ or $10^7$ dyne/cm$^2$ or more. The term "room temperature" used herein may refer to a temperature, which is neither increased nor decreased, of approximately 15 to 35° C., particularly, approximately 20 to 25° C., and more particularly, approximately 25° C. The viscosity may be measured using an advanced rheometric expansion system (ARES). When the viscosity of the curable adhesive is controlled within the above range, high processability in the process of encapsulating the organic electronic device can be obtained, and a planar surface can be encapsulated to a uniform thickness. In addition, unlike a liquid adhesive, the curable adhesive can prevent physical or chemical damage to the organic electronic device by drastically reducing problems of contraction and generation of a volatile gas which may occur due to curing of a resin. In the present invention, as long as the adhesive is maintained in a solid or semi-solid state at room temperature, the upper limit of the viscosity is not particularly limited, and for example, in consideration of processability, the viscosity may be controlled within the range of approximately $10^9$ dyne/cm$^2$ or less.

As the viscoelasticity of the lower layer of the adhesive layer at the lamination and curing temperature of the multi-layered adhesive film is controlled, and the viscosities of the first and second adhesive layers are controlled, the characteristic of overcoming a step difference can be secured, and physical and chemical damage to the organic electronic device caused by the moisture absorbent in the adhesive film can be prevented.

As a method of dividing the adhesive layer into first and second adhesive layers to have a multi-layered structure, any method of forming a multi-layered adhesive layer that is used in the conventional art may be used without limitation. In the first and second adhesive layers of the adhesive layer, other components besides a content of the moisture absorbent, for example, the kinds and contents of a curable resin, a moisture absorbent or another additive, and a filler, may be the same or different. The viscosity and viscoelasticity (modulus) of each layer may be controlled by components of an adhesive of each layer, for example, a molecular weight of a polymer resin, and a mixing ratio of a liquid epoxy resin and a solid epoxy resin.

The curable resin may have a water vapor transmission rate (WVTR) in a cured state of 50 g/m$^2$·day or less, and preferably, 30, 20, or 15 g/m$^2$·day or less. The term "cured state of a curable resin" refers to a transformed state in which the curable resin is cured or crosslinked through a reaction with or without other components such as a curing agent, and when applied as an encapsulant, components of the moisture absorbent and filler are maintained and properties of a structural adhesive are exhibited. The WVTR may be measured in a thickness direction of the cured product at 38° C. and 100% relative humidity after the curable resin is cured and the cured product is formed in a film having a thickness of 80 μm. In addition, the WVTR may be measured according to ASTM F1249.

When the WVTR is controlled within the above range, the permeation of moisture, vapor or oxygen into an organic electronic device encapsulation product may be effectively inhibited, and an effect of introducing a moisture absorbent may be exhibited.

In the present invention, as the WVTR in the cured state of the resin is decreased, the encapsulation structure has better performance. The lower limit of the WVTR is not particularly limited.

A specific kind of curable resin that can be used in the present invention is not particularly limited, and for example, may include various heat-curable or photocurable resins known in the art. The term "heat-curable resin" refers to a resin that can be cured through suitable application of heat or aging, and the term "photocurable resin" refers to a resin that can be cured by electromagnetic radiation. In addition, the electromagnetic radiation may include microwaves, IR rays, UV rays, X rays and γ rays, and particle beams such as α-particle beams, proton beams, neutron beams and electron beams. As an example of the photocurable resin, a cationic photocurable resin may be used. The cationic photocurable resin refers to a resin that can be cured by cationic polymerization or cationic curing induced by the electromagnetic radiation. In addition, the curable resin may be a dual-curable resin including both heat-curing and photocuring characteristics.

A specific kind of the curable resin is not particularly limited, as long as the curable resin has the above-described characteristics. For example, the curable resin may be a resin that can be cured to exhibit adhesive characteristics, which includes a resin including at least one heat-curable functional group such as a glycidyl group, an isocyanate group, a hydroxyl group, a carboxyl group or an amide group, or at least one functional group that can be cured by electromagnetic radiation such as an epoxide group, a cyclic ether group, a sulfide group, an acetal group or a lactone group. In addition, a specific kind of the resin may include an acryl resin, a polyester resin, an isocyanate resin or an epoxy resin, but the present invention is not limited thereto.

As the curable resin, an aromatic or aliphatic, and linear or branched epoxy resin may be used. In one exemplary embodiment of the present invention, an epoxy resin containing at least two functional groups and having an epoxy equivalent of 180 to 1,000 g/eq may be used. When the epoxy resin having the above epoxy equivalent is used, characteristics such as adhesive performance and a glass transition temperature of a cured product can be effectively maintained. Such an epoxy resin may be one or a mixture of at least two of a cresol novolac epoxy resin, a bisphenol A-type epoxy resin, a bisphenol A-type novolac epoxy resin, a phenol novolac epoxy resin, a tetrafunctional epoxy resin, a biphenyl-type epoxy resin, a triphenol methane-type epoxy resin, an alkyl-modified triphenol methane epoxy resin, a naphthalene-type epoxy resin, a dicyclopentadiene-type epoxy resin, and a dicyclopentadiene-modified phenol-type epoxy resin.

In the present invention, as an example, an epoxy resin having a ring structure in a molecular structure, and particularly, an epoxy resin including an aromatic group (e.g., a phenyl group), may be used. When the epoxy resin includes an aromatic group, a cured product may have excellent thermal and chemical stabilities and low WVTR, thereby enhancing reliability of an organic electronic device encapsulation structure. A specific example of the aromatic group-containing epoxy resin that can be used in the present invention may be one or a mixture of at least two of a biphenyl-type epoxy resin, a dicyclopentadiene-type epoxy resin, a naphthalene-type epoxy resin, a dicyclopentadiene-modified phenol-type epoxy resin, a cresol-based epoxy resin, a bisphenol-based epoxy resin, a xyloc-based epoxy resin, a multifunctional epoxy resin, a phenol novolac epoxy resin, a triphenol-methane-type epoxy resin and an alkyl-modified triphenol-methane epoxy resin, but the present invention is not limited thereto.

In the present invention, more preferably, as the epoxy resin, a silane-modified-epoxy resin, and preferably, a silane-modified epoxy resin having an aromatic group may be used. When such an epoxy resin structurally having a silane group by being modified with silane is used, adhesiveness of the organic electronic device to a glass substrate or an inorganic material substrate can be maximized, and moisture resistance or durability and reliability can be enhanced. A specific kind of the epoxy resin that can be used in the present invention is not particularly limited, and the resin may be easily obtained from a manufacturer such as Kukdo Chemical Co., Ltd.

A specific kind of the moisture absorbent is not particularly limited, and the moisture absorbent may be one or a mixture of at least two of a metal powder such as alumina, a metal oxide, a metal salt, and phosphorus pentoxide ($P_2O_5$).

Here, a specific example of the metal oxide may be lithium oxide ($Li_2O$), sodium oxide ($Na_2O$), barium oxide (BaO), calcium oxide (CaO) or magnesium oxide (MgO), the metal salt may be a sulfate such as lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$) or nickel sulfate ($NiSO_4$); a metal halide such as calcium chloride ($CaCl_2$), magnesium chloride ($MgCl_2$), strontium chloride ($SrCl_2$), yttrium chloride ($YCl_3$), copper chloride ($CuCl_2$), cesium fluoride ($CsF$), tantalum fluoride ($TaF_5$), niobium fluoride ($NbF_5$), lithium bromide ($LiBr$), calcium bromide ($CaBr_2$), cesium bromide ($CeBr_3$), selenium bromide ($SeBr_4$), vanadium bromide ($VBr_3$), magnesium bromide ($MgBr_2$), barium iodide ($BaI_2$) or magnesium iodide ($MgI_2$); or a metal chlorate such as barium perchlorate ($Ba(ClO_4)_2$) or magnesium perchlorate ($Mg(ClO_4)_2$), but the present invention is not limited thereto.

In the present invention, the moisture absorbent such as the metal oxide may be blended into the composition in a state in which the moisture absorbent is suitably processed. For example, depending on the kind of an organic electronic device to which the adhesive film is to be applied, the adhesive layer may be a thin film having a thickness of 30 μm or less, and in this case, it may be necessary to perform a grinding process on the moisture absorbent. To grind the moisture absorbent, a process with a 3-roll mill, bead mill or ball mill may be used. In addition, when the adhesive film of the present invention is applied to a top emission organic electronic device, transmittance of the adhesive layer is very important, and thus it is necessary to decrease the size of the moisture absorbent. Therefore, for such a use, the moisture absorbent has to be subjected to a grinding process.

The second adhesive layer of the curable adhesive layer of the present invention may include the moisture absorbent in an amount of 1 to 100 parts by weight or 5 to 50 parts by weight relative to 100 parts by weight of the curable resin. When the content of the moisture absorbent is controlled to 5 parts by weight or more, a cured product can have excellent waver and vapor resistance. In addition, when the content of the moisture absorbent is controlled to 5 parts by weight or less, an encapsulation structure of a thin film is formed, and excellent moisture resistance can be exhibited.

Unless particularly defined otherwise, the units "parts by weight" used herein refer to a weight ratio between components.

In addition, accordingly, the first adhesive layer of the curable adhesive layer of the present invention may include the moisture absorbent in an amount of 0 to 20 parts by weight relative to 100 parts by weight of the curable resin. When the content of the moisture absorbent is 0 parts by weight, the moisture absorbent is not included in the first adhesive layer, but is included in the second adhesive layer of the curable adhesive layer. When the content of the moisture absorbent is controlled to 20 parts by weight, vapor resistance can be maximized, and physical and chemical damage to the organic electronic device caused by the moisture absorbent can be minimized.

The first or second adhesive layer of the present invention may further include a filler. The filler is a kind of physical moisture absorbent that may extend a movement path of moisture or vapor entering into an encapsulation structure to inhibit permeation of moisture or vapor, thereby maximizing resistance to moisture and vapor through interaction between the matrix structure of a curable resin and the moisture absorbent. A specific kind of filler that can be used in the present invention may be, but is not limited to, one or a mixture of at least two of the group consisting of clay, talc, silica, zeolite, zirconia, titania and montmorillonite.

In addition, to increase binding efficiency between the filler and an organic binder, a product whose surface is treated with an organic material may be used as the filler, or a coupling agent may be further added to the filler.

The curable adhesive layer may include the filler in an amount of 1 to 50 parts by weight or 1 to 20 parts by weight relative to 100 parts by weight of the curable resin. When the content of the filler is controlled to 1 part by weight or more, a cured product having excellent moisture or vapor resistance and mechanical properties can be provided. In addition, when the content of the filler is controlled to 50 parts by weight or less, a cured product capable of being formed in a film type, and exhibiting excellent moisture resistance even when formed in a thin film, can be provided.

The curable adhesive of the first or second adhesive layer of the present invention may further include a curing agent that can form a matrix such as a crosslinking structure by reacting with a curable resin.

A specific kind of the curing agent that can be used is not particularly limited, and may be suitably selected according to the curable resin used or the kind of a functional group included in the resin. For example, when an epoxy resin is used as the curable resin in the present invention, a general curing agent for an epoxy resin known in the art may be used as the curing agent, which may be, but is not limited to, one or a mixture of at least two of an amine-based compound, an imidazole-based compound, a phenol-based compound, a phosphorus-based compound and an acid anhydride-based compound.

The curable adhesive of the first or second adhesive layer of the present invention may include the curing agent in an amount of, for example, 1 to 20 parts by weight or 1 to 10 parts by weight relative to 100 parts by weight of the curable resin. However, such a content range is only an example of the present invention. That is, the content of the curing agent may be changed according to the kind and content of the curable resin or functional group, and a matrix structure or crosslinking density to be realized.

The curable adhesive layer of the present invention may further include a high molecular weight resin. The high molecular weight resin may serve to improve moldability when the composition of the present invention is molded in a film or sheet shape. In addition, the high molecular weight resin may also serve as a high-temperature viscosity controller to control flowability in a thermal lamination process.

The kind of the high molecular weight resin that can be used in the present invention is not particularly limited, as long as the resin has compatibility with another component such as the curable resin. A specific kind of high molecular weight resin that can be used may be, but is not limited to, a resin having a weight average molecular weight of 20,000 or more that is one or a mixture of at least two of a phenoxy resin, an acrylate resin, a high molecular weight epoxy resin, an ultra-high molecular weight epoxy resin, a rubber containing a high-polarity functional group, and a reactive rubber containing a high-polarity functional group, but the present invention is not limited thereto.

When the high molecular weight resin is included in the curable adhesive layer, the content is controlled according to a desired physical property, and is not particularly limited. For example, the high molecular weight resin may be included in an amount of approximately 200 parts by weight, 150 parts by weight, or 100 parts by weight or less relative to 100 parts by weight of the curable resin. When the content of the high molecular weight resin is controlled to 200 parts by weight or less, compatibility with each component can be effectively maintained, and it can also be used as an adhesive.

The adhesive film may further include an additive such as an additional filler to enhance durability of a cured product, a coupling agent to enhance mechanical strength and adhesive strength, a plasticizer, a UV stabilizer and an antioxidant, without altering the effects of the present invention.

The structure of the adhesive film of the present invention is not particularly limited as long as the adhesive film includes the adhesive layer. For example, the adhesive film may have a base or releasing film (hereinafter, referred to as a "first film"), and a structure including the adhesive layer formed on the base or releasing film.

The adhesive film may further include a base or releasing film (hereinafter, referred to as a "second film"), which is formed on the other surface of the adhesive layer.

A specific kind of the first film that can be used in the present invention is not particularly limited. In the present invention, as the first film, for example, a general polymer film used in the art may be used. In the present invention, for example, as the base or releasing film, a polyethyleneterephthalate film, a polytetrafluoroethylene film, a polyethylene film, a polypropylene film, a polybutene film, a polybutadiene film, a vinylchloride copolymer film, a polyurethane film, an ethylene-vinyl acetate film, an ethylene-propylene copolymer film, an ethylene-acrylic acid ethyl copolymer film, an ethylene-acrylic acid methyl copolymer film or a polyimide film may be used. In addition, suitable releasing treatment may be performed on one or both surfaces of the base or releasing film of the present invention. An example of a releasing agent used in the releasing treatment of the base film may be an alkyde-, silicon-, fluorine-, fluorinated ester-, polyolefin- or wax-based agent, and among these, in terms of heat resistance, an alkyde-, silicon- or fluorine-based releasing agent is preferably used, but the present invention is not limited thereto.

In addition, the kind of the second film (also referred to below as a "cover film") that can be used in the present invention is not particularly limited either. For example, in the present invention, as the second film, a film that falls within the above-described range of the first film and is the same as or different from the first film may be used. In addition, in the present invention, suitable releasing treatment may also be performed on the second film.

A thickness of the base or releasing film described above (the first film) is not particularly limited, and may be suitably selected according to application. For example, in the present invention, the thickness of the first film may be approximately 10 to 500 µm or 20 to 200 µm. When the thickness of the film is less than 10 µm, transformation of the base film can be prevented, and when the thickness of the film is more than 500 µm, economic feasibility can be increased.

A thickness of the second film is not particularly limited either. In the present invention, for example, the thickness of the second film may be set to be the same as that of the first film. In addition, in consideration of processability, the thickness of the second film may be set to be smaller than that of the first film.

A thickness of the adhesive layer included in the adhesive film is not particularly limited, and in consideration of a use of the film, the thickness of the adhesive layer may be suitably selected according to the following conditions. For example, the first adhesive layer of the adhesive layer may have a smaller thickness than the second adhesive layer. The adhesive layer included in the adhesive film of the present invention, for example, the thickness of the first adhesive layer of the adhesive layer, may be approximately 1 to 20 µm or 2 to 15 µm. For example, when the adhesive film of the present invention is used as an encapsulant of an organic electronic device and the thickness is less than 1 µm, the ability of the second adhesive layer of the adhesive layer to protect against damage will likely be degraded, and when the thickness is more than 20 µm, the moisture resistance of the second adhesive layer of the adhesive layer may be degraded. The thickness of the second adhesive layer of the adhesive layer may be approximately 5 to 200 µm, or 5 to 100 µm. When the thickness of the second adhesive layer is less than 5 µm, sufficient moisture resistance may not be exhibited, and when the thickness of the second adhesive layer is more than 200 µm, it may be difficult to ensure processability, and thickness expansion may be increased due to moisture reactivity, thereby allowing a deposition layer of the organic electronic device to sustain damage and decreasing economic feasibility.

In the present invention, a method of manufacturing the adhesive film is not particularly limited. For example, the first and second adhesive layers of the adhesive film may be manufactured by a method including a first operation of coating a coating solution including a composition of the above-described adhesive layer on a base or releasing film, and a second operation of drying the coating solution coated in the first operation.

Methods of stacking the first and second adhesive layers are not particularly limited either. For example, the first and second adhesive layers may be formed on separate releasing films and laminated to form a multi-layered adhesive film, and the second adhesive layer may be directly formed on the first adhesive layer, and vice versa.

In the method of manufacturing the adhesive film according to the present invention, compressing a base or releasing film on the coating solution dried in the second operation may be further included as a third operation.

The first operation is to prepare a coating solution by dissolving or dispersing a composition of the above-described adhesive layer in a suitable solvent. In this operation, a content of the epoxy resin included in the coating solution may be suitably controlled according to desired moisture resistance and film moldability.

The kind of the solvent used in the preparation of the coating solution is not particularly limited. However, when a drying time of the solvent is excessively long, or drying of the solvent at a high temperature is necessary, problems in terms of workability or durability of the adhesive film may occur, and thus it is preferable that a solvent having a volatilization temperature of 100° C. or less be used. In addition, in consideration of film moldability, a small amount of a solvent having a volatilization temperature beyond the above range may be mixed in. As an example of the solvent that can be used in exemplary embodiments of the present invention, one or a mixture of at least two of methylethylketone (MEK), acetone, toluene, dimethylformamide (DMF), methylcellosolve (MCS), tetrahydrofuran (THF) or N-methylpyrollidone (NMP) can be used, but the present invention is not limited thereto.

In the first operation, a method of coating the coating solution on the base or releasing film is not particularly limited, and a known method such as knife coating, roll coating, spray coating, gravure coating, curtain coating, comma coating or lip coating may be used without limitation.

The second operation is to form an adhesive layer by drying the coating solution coated in the first operation. That is, in the second operation, the adhesive layer may be formed by drying and removing a solvent by heating the coating solution coated on the film. Here, a drying condition is not particularly limited, and the drying may be performed at 70 to 200° C. for 1 to 10 minutes.

In the method of manufacturing the adhesive film, compressing another base or releasing film on the adhesive layer formed on the film after the second operation may be further included as a third operation.

This third operation may be performed by compressing another releasing or base film (a cover film or a second film) on the dried adhesive layer by a hot roll laminating or pressing process, after coating the adhesive layer. Here, the third operation may be performed by hot roll laminating in order to enable an efficient, continuous process. Here, the process may be performed at approximately 10 to 100° C. and a pressure of approximately 0.1 to 10 kgf/cm².

Another exemplary embodiment of the present invention provides an organic electronic device encapsulation product including a substrate; an organic electronic device formed on the substrate; and the above-described adhesive film encapsulating the organic electronic device, in which a first adhesive layer of an adhesive layer of the adhesive film covers an entire surface of the organic electronic device. In the present invention, the organic electronic device may be an organic light emitting diode.

The organic electronic device encapsulation product may further include a protective layer to protect the organic electronic device between the adhesive film and the organic electronic device.

Still another exemplary embodiment of the present invention provides a method of encapsulating an organic electronic device that includes applying a first adhesive layer of an adhesive layer of the above-described adhesive film to a substrate on which an organic electronic device is formed, to cover the organic electronic device, and curing the adhesive layer.

The operation of applying the adhesive film to the organic electronic device may be performed by hot-roll laminating, hot pressing or vacuum compressing the adhesive film, but the present invention is not particularly limited.

The operations of applying the adhesive film to the organic electronic device and curing the adhesive layer may be performed at 60 to 100° C.

In addition, the method may further include attaching the adhesive film to face an additional encapsulation material such as glass or metal.

FIG. 1 is a cross-sectional view of an encapsulation product of an organic electronic device according to an exemplary embodiment of the present invention.

In the present invention, the method of encapsulating an organic electronic device includes forming a transparent electrode on a substrate 1 such as glass or a polymer film by a method such as vacuum deposition or sputtering, and forming an organic material layer on the transparent electrode. The organic material layer may include a hole injection layer, a hole transport layer, an emission layer, an electron injection layer and/or an electron transport layer. Subsequently, the above-described adhesive film 3 is applied to top surfaces of several organic electronic devices 2 on the substrate 1 to cover entire surfaces of the organic electronic devices. Here, a method of applying the adhesive film 3 is not particularly limited, and may be a method of heating or compressing a cover substrate 4 (e.g., glass or a polymer film) to which the above-described adhesive layer of the adhesive film of the present invention has been previously transfer-printed on a top surface of the organic electronic device 2 formed on the substrate 1. In this operation, for example, when the adhesive film 3 is transfer-printed on the cover substrate 4, the above-described adhesive film may be transfer-printed on the cover substrate 4 using a vacuum press or vacuum laminator by applying heat after a base or releasing film formed on the film is peeled off. In this operation, when a curing reaction of the adhesive film is performed outside of a certain range, cohesive strength or adhesive strength of the adhesive film 3 may be decreased. Accordingly, a process temperature and a process time are controlled to approximately 100° C. or less and approximately 5 minutes, respectively. Similarly, even when the cover substrate 4 on which the adhesive film 3 is transfer-printed is heat-compressed on the organic electronic device, a vacuum press or vacuum laminator may be used. A temperature condition for this operation may be set as described above, and a process time may be within 10 minutes. However, the adhesive film is applied to the organic electronic device such that a first adhesive layer 3a is closer to the organic electronic device than a second adhesive layer 3b of the adhesive film (to be in contact with a protective layer when the organic electronic device includes a protective layer).

In addition, an additional curing process may be performed on the adhesive film to which the organic electronic device is compressed, and such a curing process (main curing) may be performed, for example, in a heating chamber or UV chamber. A curing condition in the main curing process may be suitably selected in consideration of stability of the organic electronic device.

However, the above-described forming process is merely an example for encapsulating an organic electronic device, and the process sequence and conditions may be freely changed. For example, the sequence of the transfer-printing and compressing processes may be changed so that the adhesive film 3 is first transfer-printed to the organic electronic device 2 on the substrate 1, followed by compressing the cover substrate 4. In addition, after the protective layer is formed on the organic electronic device 2, the adhesive film 3 may be applied and then cured without the cover substrate 4.

Hereinafter, the present invention will be described in further detail with reference to Examples according to the present invention and Comparative Examples not according to the present invention, but the scope of the present invention is not limited to the following Examples.

EXAMPLE 1

1. Preparation of Solution for First Adhesive Layer 70 parts by weight of a bisphenol A-type liquid epoxy resin (eqw.200), 30 parts by weight of a bisphenol A-type solid epoxy resin (eqw.500), and 100 parts by weight of a high molecular weight bisphenol A-type epoxy resin (Mw 50K) were put into a reaction vessel, and the resulting mixture was diluted with methylethylketone. Afterward, an inside of the reaction vessel was replaced with nitrogen, and the prepared solution was homogenized. 5 parts by weight of imidazole (2MA-OK) was put into the homogenized solution as a curing agent, and stirred at a high speed for 1 hour, thereby preparing a solution for a first adhesive layer.

2. Preparation of Solution for Second Adhesive Layer

A moisture absorbent solution was prepared by putting 40 parts by weight of CaO (Aldrich) as a moisture absorbent into methylethylketone at a concentration of 30 wt %, and the solution was milled in a ball-mill process for 24 hours. In addition, separately, 60 parts by weight of a bisphenol A-type liquid epoxy resin (eqw.200), 40 parts by weight of a bisphenol A-type solid epoxy resin (eqw.500), and 100 parts by weight of a high molecular weight bisphenol A-type epoxy resin (Mw 50K) were put into a reaction vessel at room temperature and diluted with methylethylketone. Afterward, an atmosphere inside the reaction vessel was replaced with nitrogen and the prepared solution was homogenized. The previously prepared moisture absorbent solution was put into the homogenized solution, 5 parts by weight of imidazole (2MA-OK) was input as a curing agent, and the resulting mixture was stirred at a high speed for 1 hour, thereby preparing a solution for a second adhesive layer.

3. Preparation of Adhesive Film

An adhesive layer having a thickness of 15 µm was formed by coating the above-prepared solution for the first adhesive layer on a releasing surface of a releasing PET using a comma coater, and drying the resulting surface with a drier at 130° C. for 3 minutes.

An adhesive layer having a thickness of 30 µm was formed by coating the above-prepared solution for the second adhesive layer on a releasing surface of a releasing PET using a comma coater, and drying the resulting surface with a drier at 130° C. for 3 minutes.

Adhesive layers of the first and second adhesive layers were laminated, thereby manufacturing a multi-layered adhesive film.

EXAMPLE 2

A multi-layered adhesive film was manufactured by the same method as described in Example 1, except that, in the operation of manufacturing an adhesive film of Example 1, 100 parts by weight of a high molecular weight bisphenol A-type epoxy resin (Mw 80K), instead of a high molecular weight bisphenol A-type epoxy resin (Mw 50K), was added to a solution of a first adhesive layer, and 100 parts by weight of a high molecular weight bisphenol A-type epoxy resin (Mw 80K), instead of a high molecular weight bisphenol A-type epoxy resin (Mw 50K), was added to a solution of a second adhesive layer.

EXAMPLE 3

A multi-layered adhesive film was manufactured by the same method as described in Example 1, except that, in the operation of manufacturing an adhesive film of Example 1, 40 parts by weight of a bisphenol A-type liquid epoxy resin (eqw.200) and 60 parts by weight of a bisphenol A-type solid epoxy resin (eqw.500) were added, and 100 parts by weight of a high molecular weight bisphenol A-type epoxy resin (Mw 80K), instead of a high molecular weight bisphenol A-type epoxy resin (Mw 50K), was added to a solution of a first adhesive layer, and 70 parts by weight of a bisphenol A-type liquid epoxy resin (eqw.200) and 30 parts by weight of a bisphenol A-type solid epoxy resin (eqw.500) were added to a solution of a second adhesive layer.

COMPARATIVE EXAMPLE 1

A multi-layered adhesive film was manufactured by the same method as described in Example 1, except that 150 parts by weight of a bisphenol A-type liquid epoxy resin (eqw.200) and 50 parts by weight of a high molecular weight bisphenol A-type epoxy resin (Mw 50K), instead of a bisphenol A-type solid epoxy resin (eqw.500), were added, and 7 parts by weight of the imidazole (2MA-OK), a curing agent, was added to a solution of a second adhesive layer of Example 1.

COMPARATIVE EXAMPLE 2

A multi-layered adhesive film was manufactured by the same method as described in Example 1, except that 10 parts by weight of a bisphenol A-type liquid epoxy resin (eqw.200), 90 parts by weight of a bisphenol A-type solid epoxy resin (eqw.500), and 100 parts by weight of a high molecular weight bisphenol A-type epoxy resin (Mw 80K), instead of a high molecular weight bisphenol A-type epoxy resin (Mw 50K), were added to a solution of a first adhesive layer of Example 1, and 10 parts by weight of a bisphenol A-type liquid epoxy resin (eqw.200), 90 parts by weight of a bisphenol A-type solid epoxy resin (eqw.500), and 100 parts by weight of a high molecular weight bisphenol A-type epoxy resin (Mw 80K), instead of a high molecular weight bisphenol A-type epoxy resin (Mw 50K), were added to a solution of a second adhesive layer.

COMPARATIVE EXAMPLE 3

A multi-layered adhesive film was manufactured by the same method as described in Example 1, except that 150 parts by weight of a bisphenol A-type liquid epoxy resin (eqw.200) and 50 parts by weight of a high molecular weight bisphenol A-type epoxy resin (Mw 50K) were put into a reaction vessel instead of a bisphenol A-type solid epoxy resin (eqw.500), the resulting mixture was diluted with methylethylketone, and 7 parts by weight of imidazole (2MA-OK), a curing agent, was added.

TABLE 1

|  |  | Example1 | Example2 | Example3 | Comparative Example1 | Comparative Example2 | Comparative Example3 |
|---|---|---|---|---|---|---|---|
| FIRST ADHESIVE LAYER | Bisphenol A-type liquid epoxy (eqw.200) | 70 | 70 | 40 | 70 | 10 | 150 |
|  | Bisphenol A-type solid epoxy (eqw.500) | 30 | 30 | 60 | 30 | 90 | — |
|  | High molecular weight bisphenol A-type epoxy (Mw.50K) | 100 | — | — | 100 | — | 50 |
|  | High molecular weight bisphenol A-type epoxy (Mw.80K) | — | 100 | 100 | — | 100 | — |

TABLE 1-continued

|  |  | Example1 | Example2 | Example3 | Comparative Example1 | Comparative Example2 | Comparative Example3 |
|---|---|---|---|---|---|---|---|
| | Imidazole curing agent (2MA-OK) | 5 | 5 | 5 | 5 | 5 | 7 |
| SECOND ADHESIVE LAYER | Bisphenol A-type liquid epoxy (eqw.200) | 60 | 60 | 70 | 150 | 10 | 60 |
| | Bisphenol A-type solid epoxy (eqw.500) | 40 | 40 | 30 | — | 90 | 40 |
| | High molecular weight bisphenol A-type epoxy (Mw.50K) | 100 | — | 100 | 50 | — | 100 |
| | High molecular weight bisphenol A-type epoxy (Mw.80K) | — | 100 | — | — | 100 | — |
| | Imidazole curing agent (2MA-OK) | 5 | 5 | 5 | 7 | 5 | 5 |
| | Calcium oxide | 40 | 40 | 40 | 40 | 40 | 40 |
| Viscosity of second adhesive layer (P, 60° C./100° C.) | | 260K/7K | 290K/9K | 240K/5K | 100K/2K | 720K/1K | 260K/7K |
| Viscosity of first adhesive layer (P, 60° C./100° C.) | | 130K/3K | 150K/4K | 200K/5K | 130K/3K | 380K/8K | 60K/1K |
| Prevention of precipitation of filler (60° C. lamination/100° C. curing) | | O | O | O | X | O | O |
| Base wettability (60° C.) | | O | O | O | O | X | O |
| First adhesive layer tanδ (60° C./100° C.) | | 1.3/4.3 | 1.2/4.2 | 1.1/3.8 | 1.3/4.3 | 0.8/3.3 | 1.7/7.5 |
| Overcoming of step difference and external characteristic | | O | O | O | O | X | X |

As shown in Table 1, in Comparative Example 1, the second adhesive layer had a low viscosity which resulted in precipitation and formation of burrs in lamination and curing. In addition, in Comparative Example 2, the first and second adhesive layers had high viscosities which resulted in poor base wettability and insufficient flowability, and thus lacked the ability to overcome a step difference. In Comparative Example 3, the first adhesive layer had a very low viscosity which led to formation of burrs in lamination and curing due to excessive flow.

While the invention has been shown and described with reference to certain exemplary embodiments thereof, it will be understood by those skilled in the art that various changes in form and details may be made therein without departing from the scope of the invention as defined by the appended claims.

DESCRIPTION OF REFERENCE NUMERALS

1: substrate
2: organic electronic device
3: adhesive film
3a: first adhesive film
3b: second adhesive film
4: cover substrate

What is claimed is:

1. An adhesive film for encapsulating an organic electronic element, comprising:
    a first adhesive layer having a loss coefficient tan δ at 60 to 100° C. of 1 to 5; and
    a second adhesive layer on one surface of the first adhesive layer, and
    wherein the first adhesive layer has a lower viscosity than the second adhesive layer.

2. The adhesive film according to claim 1, wherein the adhesive film comprises a curing resin and a moisture absorbent, and the moisture absorbent is included at 0 to 20% in the first adhesive layer, and at 80 to 100% in the second adhesive layer, based on a total weight of the moisture absorbents in the first and second adhesive layers.

3. The adhesive film according to claim 1, wherein the first adhesive layer is a layer in contact with an organic electronic element, and the second adhesive layer is a layer not in contact with the organic electronic element.

4. The adhesive film according to claim 1, wherein the first or second adhesive layer has a viscosity at 60 to 100° C. of 3,000 to 300,000 poises.

5. The adhesive film according to claim 4, wherein the first or second adhesive layer has a viscosity at 60 to 100° C. of 5,000 to 300,000 poises.

6. The adhesive film according to claim 2, wherein the curable resin has a water vapor transmission rate (WVTR) in a cured state of 50 g/m²·day or less.

7. The adhesive film according to claim 2, wherein the curable resin is a heat-curable resin, a photocurable resin or a dual-curable resin.

8. The adhesive film according to claim 2, wherein the moisture absorbent is alumina, a metal oxide, a metal salt, or phosphorus pentoxide.

9. The adhesive film according to claim 8, wherein the moisture absorbent is at least one selected from the group consisting of $P_2O_5$, $Li_2O$, $Na_2O$, $BaO$, $CaO$, $MgO$, $Li_2SO_4$, $Na_2SO_4$, $CaSO_4$, $MgSO_4$, $CoSO_4$, $Ga_2(SO_4)_3$, $Ti(SO_4)_2$, $NiSO_4$, $CaCl_2$, $MgCl_2$, $SrCl_2$, $YCl_3$, $CuCl_2$, $CsF$, $TaF_5$, $NbF_5$, $LiBr$, $CaBr_2$, $CeBr_3$, $SeBr_4$, $VBr_3$, $MgBr_2$, $BaI_2$, $MgI_2$, $Ba(ClO_4)_2$ and $Mg(ClO_4)_2$.

10. The adhesive film according to claim 2, wherein the second adhesive layer comprises the moisture absorbent in an amount of 1 to 100 parts by weight relative to 100 parts by weight of the curable resin.

11. The adhesive film according to claim 2, wherein the first adhesive layer comprises the moisture absorbent in an amount of 0 to 20 parts by weight relative to 100 parts by weight of the curable resin.

12. The adhesive film according to claim 2, wherein the first or second adhesive layer further comprises a filler.

13. The adhesive film according to claim 12, wherein the filler is at least one selected from the group consisting of clay, talc, silica, zeolite, zirconia, titania and montmorillonite.

14. The adhesive film according to claim 2, wherein the first or second adhesive layer further comprises a curing agent.

15. The adhesive film according to claim 2, wherein the first or second adhesive layer further comprises a high molecular weight resin.

16. A method of encapsulating an organic electronic device, comprising:
   laminating a first adhesive layer of the adhesive film of claim 1 on a substrate having an organic electronic device to be in contact with an organic electronic element; and
   curing the adhesive film.

17. The method according to claim 16, wherein the first adhesive layer is laminated to cover an entire surface of the organic electronic element.

18. The method according to claim 16, further comprising:
   maintaining the adhesive film comprising the first adhesive layer in contact with the organic electronic element at 60° C. to 100° C.

19. An organic electronic device, comprising:
   a substrate;
   an organic electronic element formed on the substrate; and
   the adhesive film of claim 1 encapsulating the organic electronic element.

* * * * *